(12) United States Patent
Sommer

(10) Patent No.: US 7,112,496 B2
(45) Date of Patent: Sep. 26, 2006

(54) METHOD AND STRUCTURE OF AN AUXILIARY TRANSISTOR ARRANGEMENT USED FOR FABRICATING A SEMICONDUCTOR MEMORY DEVICE

(75) Inventor: Michael Bernhard Sommer, Raubling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/864,321

(22) Filed: Jun. 10, 2004

(65) Prior Publication Data

US 2005/0037564 A1 Feb. 17, 2005

(30) Foreign Application Priority Data

Jun. 11, 2003 (DE) ................ 103 26 330

(51) Int. Cl.
*H01L 21/336* (2006.01)

(52) U.S. Cl. ...................................... 438/301

(58) Field of Classification Search ................ 438/197, 438/299, 301
See application file for complete search history.

(56) References Cited

U.S. PATENT DOCUMENTS

| 4,424,526 A | 1/1984 | Dennard et al. | |
| 6,521,487 B1 * | 2/2003 | Chen et al. | 438/133 |
| 2002/0185662 A1 | 12/2002 | Watatani | |

FOREIGN PATENT DOCUMENTS

DE 3931381 A1 3/1991

* cited by examiner

*Primary Examiner*—Scott B. Geyer
(74) *Attorney, Agent, or Firm*—Slater & Matsil, L.L.P.

(57) ABSTRACT

Method for fabricating a semiconductor memory device having auxiliary transistor structures which are required for lithography and etching processes. A protective structure for reducing leakage currents between gate conductor and doped zone is provided. The protective structure is formed as a region doped oppositely to the doped zone.

14 Claims, 4 Drawing Sheets

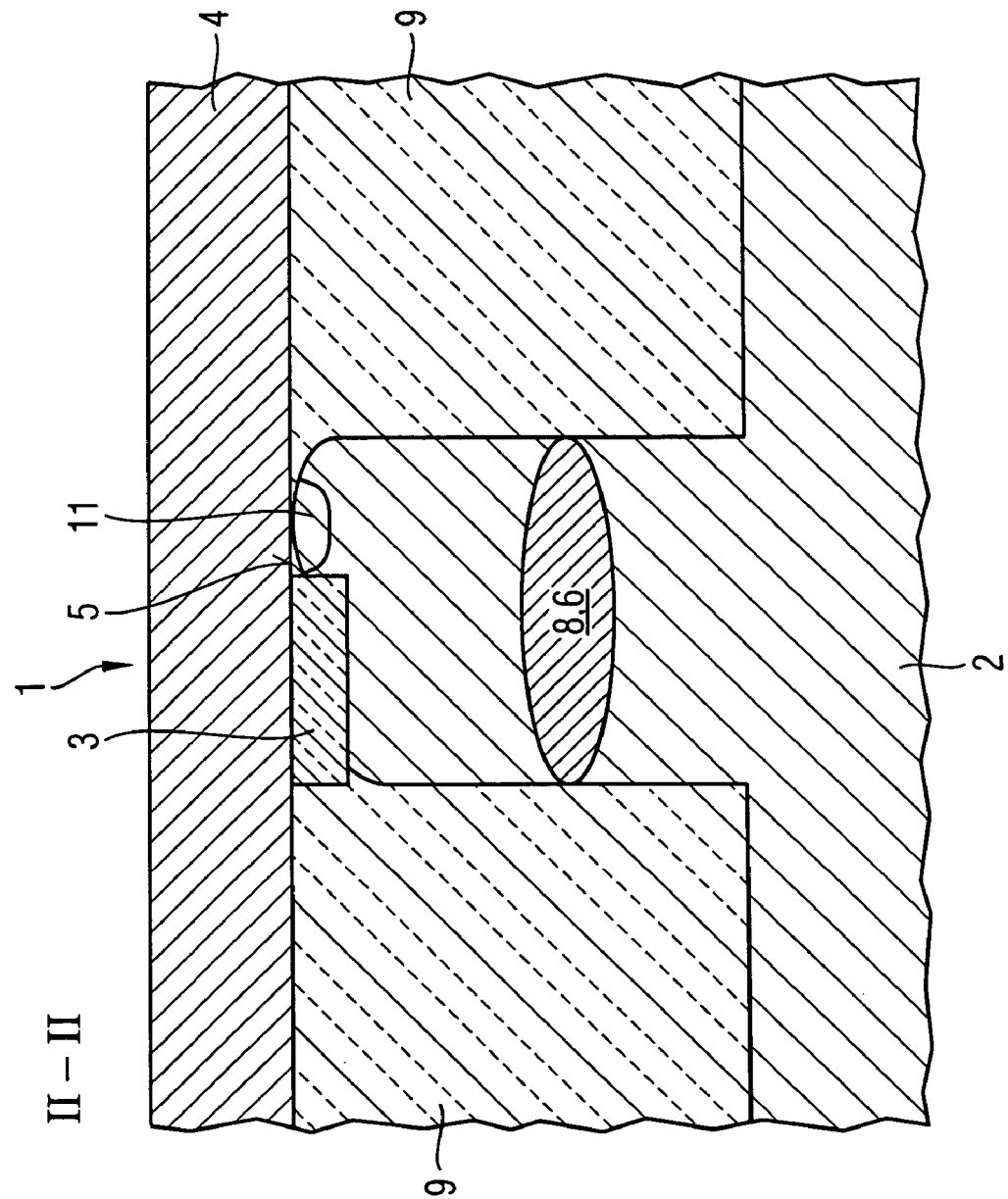
FIG 3
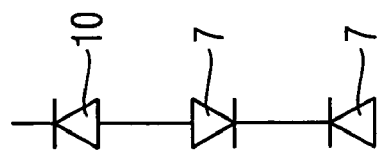

METHOD AND STRUCTURE OF AN AUXILIARY TRANSISTOR ARRANGEMENT USED FOR FABRICATING A SEMICONDUCTOR MEMORY DEVICE

BACKGROUND

1. Field of the Invention

The invention relates generally to methods for fabricating semiconductor memory devices, and in particular to an auxiliary transistor structure used in semiconductor device fabrication.

2. Background of the invention

Dynamic Random Access Memory (DRAM) chips are distinguished by having a regular arrangement in a memory cell array assigned to a memory area. In the course of a transition from the memory area to the periphery, which may be provided with logic circuits, for example, the regular arrangement is interrupted. Topology differences lead to irregularities both during a lithographic imaging and during a subsequent etching process.

In order to avoid these difficulties, auxiliary transistor structures are provided at the edge of the memory cell array. The auxiliary transistor structures are based on the transistor structures in the memory cell array but have no functionality. In general, the auxiliary transistor structures comprise a weakly p-doped zone on which a gate structure with gate oxide and gate conductor is provided, and such transistors have an influence on lithography and etching processes but no relevance whatsoever to the electrical circuit. The auxiliary transistor structures are usually positioned as a frame at the edge of the memory cell array. During the processing of the frame, however, contaminants often occur in the gate oxide and enable an electrically conductive connection of gate conductor and p-doped zone. Such gate oxide breakdowns are harmful since, on the one hand, a standby current may increase appreciably and, on the other hand, locally at the edge of the memory cell array, a potential of the p-type zone may change and thus adversely affect the performance of the DRAM memory chip.

In accordance with the prior art, a loss of yield that has arisen in the production of DRAM memory chips on account of deficiencies during the processing of auxiliary structures has hitherto been accepted. A mechanism which might have contributed to keeping the loss of yield within tolerable limits is the formation of a parasitic diode. Since the gate conductor assigned to the auxiliary transistor structures is situated on very weakly doped silicon, the pure p-doped zone, at locations at which the gate oxide is not present on account of processing inaccuracies, a metal-semiconductor compound may be formed in the form of a diode which is similar to a Schottky Diode. If the gate conductor is at a more positive potential than the p-doped zone, the diode causes blocking and thus prevents possible leakage current between gate conductor and p-doped zone. By contrast, if the gate conductor is at a more negative potential than the p-doped zone, the diode opens.

Since a trend toward evermore negative reverse voltages of the n-type field-effect application transistors is apparent in more recent DRAM memory chip designs, the latter are coming closer and closer into a voltage range in which the parasitic diode opens. In conjunction with the opened parasitic diode, gate oxide breakdowns occur repeatedly and cause an appreciable leakage current between gate conductor and p-doped zone. Typical potentials of the p-doped zone are 0 or −0.1 V, for example. The reverse voltage of the application transistors may typically be at −0.5 V. Given such a combination, the parasitic diode may already open completely and bring about an undesirable leakage current.

In light of the forgoing it will be appreciated that a need exists to reduce leakage in DRAM memories.

BRIEF SUMMARY

In an exemplary embodiment of the present invention, a method for fabricating a semiconductor memory device includes providing auxiliary transistor structures required for a lithography step in the semiconductor substrate for the purpose of compensating for topology differences. A zone which adjoins a section of the semiconductor substrate surface and is doped with a dopant of a first conduction type is provided for the auxiliary transistor structure. A gate oxide is provided over a portion of the section and a conductive layer formed into a gate conductor is provided essentially on the gate oxide. Accordingly, a protective structure for preventing a leakage current path from arising between gate conductor and doped zone is provided in the doped zone.

In another embodiment of the present invention, an auxiliary transistor structure in a semiconductor substrate includes a zone which adjoins a section of the substrate surface and is doped with a dopant of a first conduction type. Over a portion of the section of the substrate surface, are provided a gate oxide and, essentially on the gate oxide, a conductive layer formed into a gate conductor. A protective structure for preventing a leakage current path from arising between gate conductor and doped zone is provided in the doped zone.

In another embodiment of the present invention, a method for fabricating a semiconductor memory device comprises introducing an auxiliary transistor structure required for a lithography step into a semiconductor substrate for the purpose of compensating for topology differences. A zone adjoining a section of the substrate surface is doped with a dopant of a first conduction type. A gate oxide is applied over a portion of the section, and a conductive layer serving as gate conductor is applied essentially on the gate oxide. The resulting protective structure extends between two isolation trenches and adjoins the latter, and acts to prevent a leakage current path from arising between gate conductor and doped zone is implanted in the doped zone.

In another embodiment of the present invention, an auxiliary transistor structure in a semiconductor substrate includes a doped zone that adjoins a section of the substrate surface and is doped with a dopant of a first conduction type. A gate oxide provided over a portion of the section of the substrate surface. A conductive layer is essentially provided over the gate oxide and is formed as a gate conductor. A protective structure is formed in the doped zone and extends between two isolation trenches and adjoins the isolation trenches.

BRIEF DESCRIPTION OF THE DRAWINGS

FIG. 3 illustrates a cross section through the auxiliary transistor structure along the sectional plane II of FIG. 2.

DETAILED DESCRIPTION OF THE INVENTION

Figure 1:
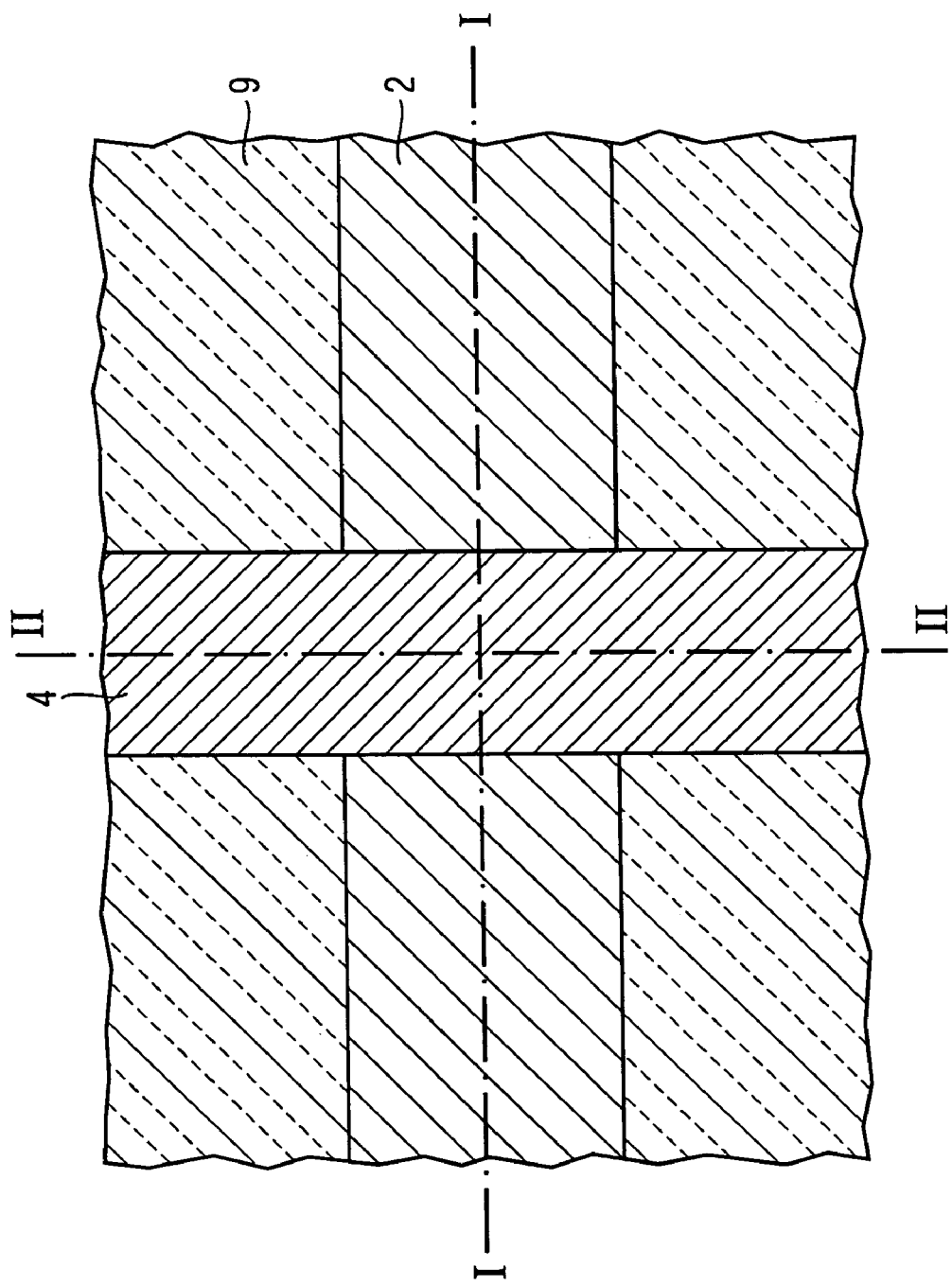
FIG. 1 illustrates an auxiliary transistor structure in plan view with sectional planes I and II, according to an exemplary embodiment of the present invention.

FIG. 1 illustrates an auxiliary transistor structure in plan view, according to an embodiment of the present invention. A doped zone 2—adjoining isolation trenches 9—of the auxiliary transistor structure 1 with gate conductor 4 is depicted in FIG. 1 in plan view. The broken lines I and II identify the sectional planes illustrated in the subsequent figures.

Figure 2:
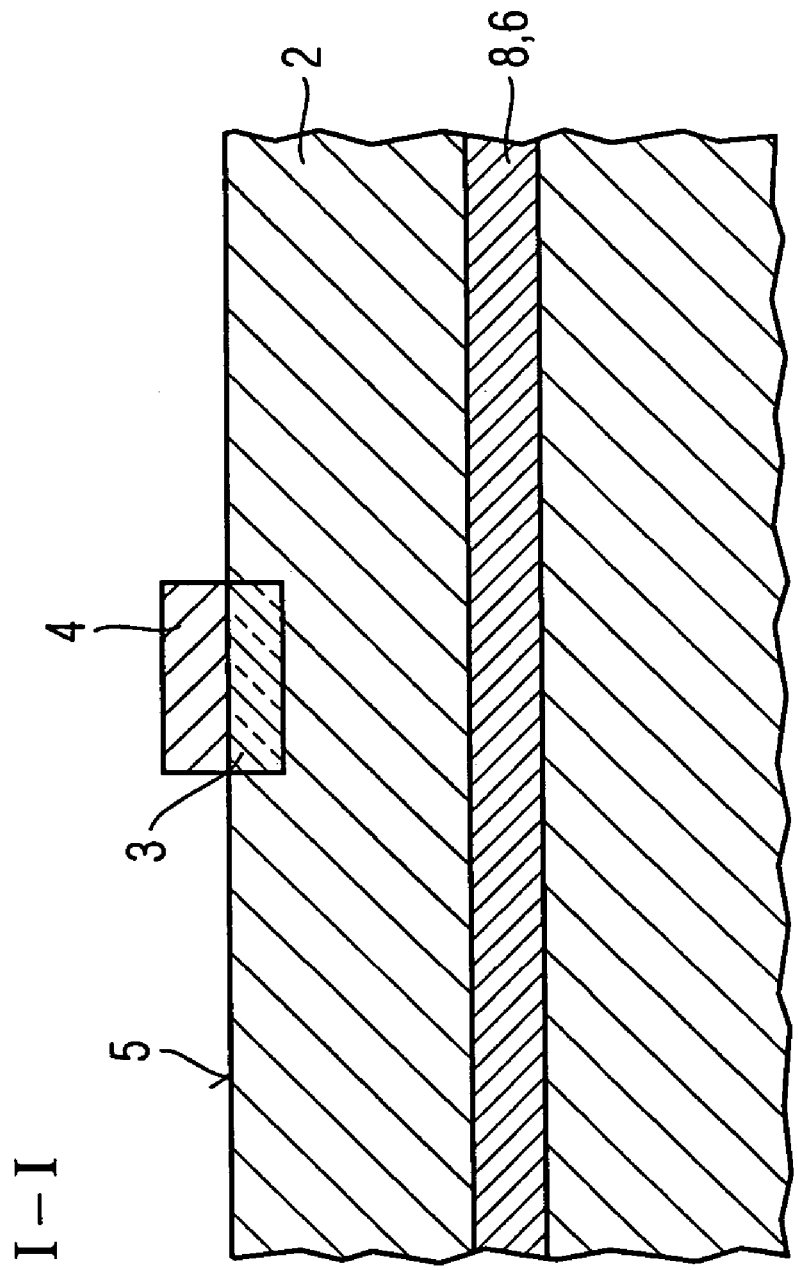
FIG. 2 illustrates a cross section through the auxiliary transistor structure along the sectional plane I of FIG. 1.

In order to form auxiliary transistor structure 1, a weakly p-doped zone 2 adjoining a section 5 of the semiconductor substrate surface is provided, a gate oxide 3 being arranged over a portion of section 5 over protective structure 6, as illustrated in FIG. 2 for the sectional plane I of FIG. 1. Protective structure 6 is for preventing a leakage current path from arising between gate conductor 4 and doped zone 2. Protective structure 6 is provided as an n-doped region 8, as a result of which a PNP junction is produced vertically with respect to the substrate surface.

Protective structure 6, which is formed as two diodes 7 (see FIG. 3) connected oppositely perpendicular to the substrate surface, is realized by means of an n-doped region 8 in the weakly p-doped zone 2. The cross section along sectional plane II—II of FIG. 1 shows gate conductor 4, which adjoins isolation trenches 9, the gate oxide 3 and p-doped zone 2. At the location at which gate conductor 4 touches doped zone 2, a space charge zone 11 arises, which is represented as parasitic diode 10. Doped region 8 adjoining isolation trenches 9 can be seen essentially below gate oxide 3. The n-doped region may be introduced into the p-doped zone 2 by means of an XP Halo implanter. In terms of its extent, the n-doped region 8 is provided such that it directly adjoins isolation trenches 9. This produces a terminated PNP junction which, in terms of its mode of action, corresponds to that of two diodes 7 connected back-to-back and prevents a possible leakage current between gate conductor 4 and doped zone 2. Gate conductor 4 has an interface with the isolation trenches 9, with gate oxide 3 and with p-doped zone 2. The interface with p-doped zone 2 arises as a result of imprecise processing during which gaps can occur between isolation trenches 9 and gate oxide 3, so that the gate conductor 4 touches the p-doped zone 2 in the gaps. This results in a junction between a metal of the gate conductor 4 and weakly p-doped zone 2. Parasitic diode 10 formed by such a junction acts in a similar manner to a Schottky-Diode. If the gate conductor 4 is at a positive potential with respect to the doped zone 2, then parasitic diode 10 causes blocking. By contrast, if gate conductor 4 is at a negative potential, then diode 10 opens. In conjunction with the opening of parasitic diode 10, gate oxide 3 breakdowns may also occur. In order to prevent the resultant leakage current, protective structure 6 is provided. The upper PN junction realized by protective structure 6 acts as a diode 7 connected in the reverse direction at negative gate conductor 4 potential, as a result of which gate oxide breakdowns and thus a possible leakage current are effectively prevented.

Figure 4:
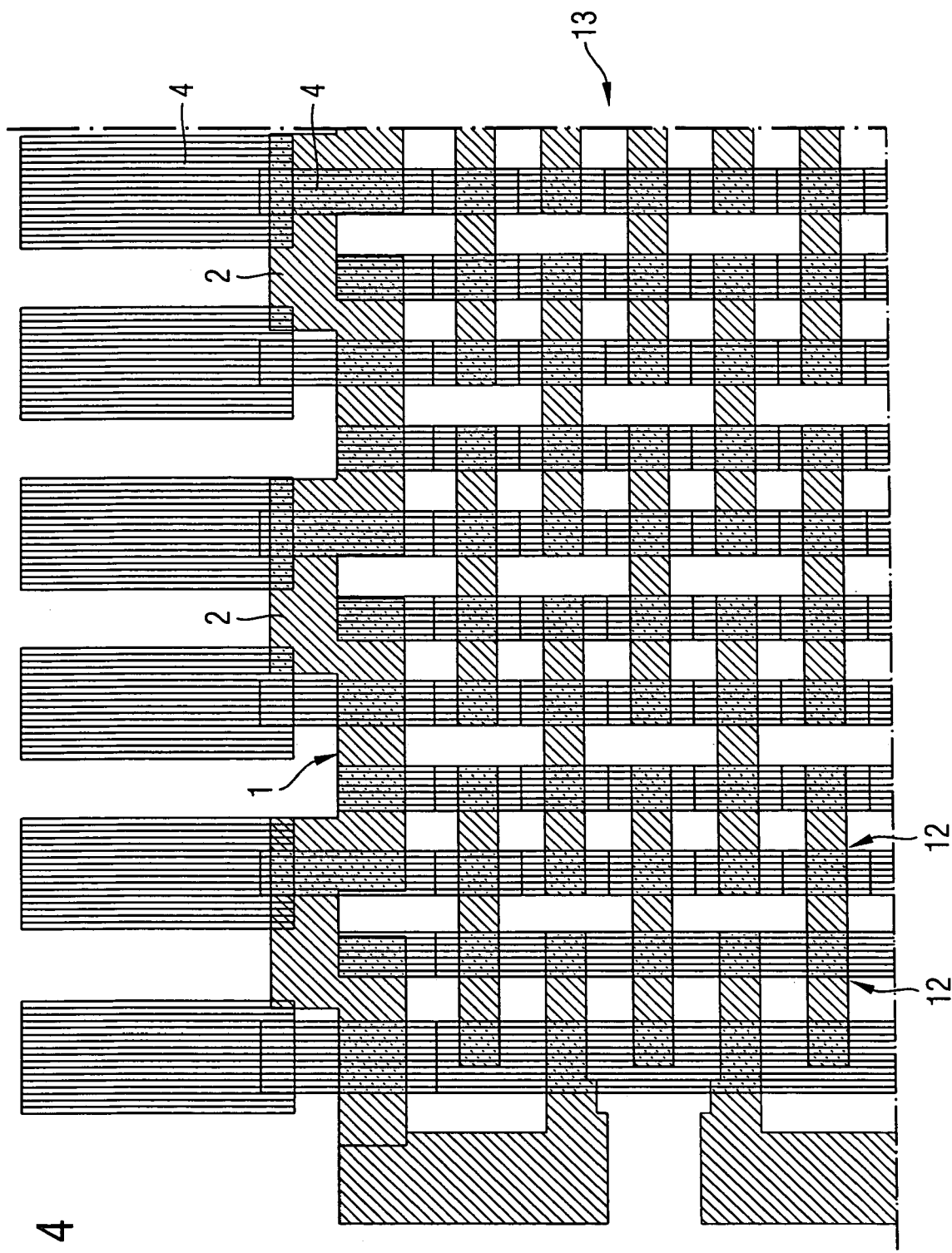
FIG. 4 illustrates a layout for an auxiliary transistor structure according to an exemplary embodiment of the present invention.

A detail from a layout containing a memory cell array 13 with application transistors 12 can be seen in FIG. 4. Memory cell array 13 is partly surrounded by doped zone 2, which is arranged as a frame and in which auxiliary transistors 1 are provided. Gate structures of application transistors 12 and of auxiliary transistors 1 are connected to one another by gate conductors 4.

Thus, by virtue of the provision of a protective structure in the doped zone, which protective structure prevents a leakage current path from arising, gate oxide breakdowns and resultant leakage currents are avoided between gate conductor and doped zone in the case of most of the voltage states that occur. Consequently, an increase in the standby current, that is, the current required by the semiconductor memory device if it does not have to execute any operations, and a disadvantageous change of a potential assigned to the doped zone are avoided. As a result, it is possible to obtain a higher product quality and product yield. Moreover, the additional protective structure affords more leeway relative to the choice of a negative gate conductor potential and the potential of the doped zone. Preventing a possible leakage current extends the process window of production, in particular that of an isolation trench etching. This is because fault sources which can promote leakage currents are produced by the etching process. By preventing a possible leakage current path from arising, the requirements made of the etching process are relaxed and a larger process window results. The resultant advantage can be discerned principally in an increased production yield.

In an advantageous manner, the protective structure is provided as an arrangement of at least two diodes, connected oppositely in series, and perpendicular to the substrate surface. By virtue of the fact that the protective structure is provided as an arrangement of oppositely connected diodes which runs perpendicular to the substrate surface, a leakage current between gate conductor and doped zone is avoided in the case of virtually all voltage states between the gate conductor and doped zone.

In embodiments of the present invention, a region which is arranged at a distance from the section of the substrate surface and is doped with a dopant of a second conduction type opposite to the first conduction type is provided in order to form the arrangement of diodes in the doped zone. In an advantageous manner, either an npn junction or a pnp junction arises by virtue of the provision of a doped region of a second conduction type, opposite to the first conduction type, in the doped zone, depending on whether the doped zone is doped with a dopant of an n conduction type or a p conduction type. In terms of their mode of action, pnp or npn junctions correspond to oppositely connected diodes. The concept of oppositely connected diodes which are vertical with respect to the substrate surface is realized in a simple manner by the introduction of an opposite doped region with respect to the doped zone.

The doped region is introduced by means of a counter implantation. For the counter implantation, it is possible to use an implantation step that is already present during processing, for example that of a Halo implant, or pocket implant for producing the doped region. This advantageously achieves a higher product quality and yield without an additional process step, that is to say, without additional process costs.

The spatial extent of the doped region provided is such that the doped region advantageously adjoins isolation trenches which are provided in the semiconductor substrate and adjoin the doped zone. The doped zone assigned to the auxiliary transistor structures is electrically isolated from application transistors assigned to a memory cell array by isolation trenches. If the doped region directly adjoins the isolation trenches, then the doped region is terminated and the formation of leakage current paths is prevented.

The protective structure prevents, in particular, a leakage current path from arising between gate conductor and doped zone in the case of negative voltages at the gate conductor. Moreover, the requirements made of the gate oxide are relaxed. Overall, it is possible to extend the process window of production, on account of preventing a leakage current path from arising The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for fabricating a semiconductor device that includes auxiliary transistor structures, comprising:
   providing a first zone for the auxiliary transistor structures that adjoins a section of a substrate surface and is doped with a dopant of a first conduction type;
   providing a gate oxide over a portion of the section;
   providing a conductive layer formed as a gate conductor on the gate oxide and on the first zone adjoining the section of the substrate surface; and
   forming a protective structure for preventing a leakage current path from arising between the gate conductor and the first doped zone, wherein the protective structure includes at least two diodes connected oppositely in series and formed from a second doped region that is arranged at a distance from the section of the substrate surface and is doped with a second dopant of a second conduction type opposite to the first conduction type.

2. The method of claim 1, wherein the auxiliary transistor structures aid a lithography step and are provided in a semiconductor substrate for compensating for topology differences.

3. The method of claim 1, wherein the second doped region is introduced by means of a counter implantation.

4. The method of claim 3, wherein the spatial extent of the doped region is provided such that the second doped region adjoins isolation trenches that are provided in the semiconductor substrate and adjoin the doped zone.

5. The method of claim 1, wherein applying a conductive layer formed as a gate conductor on the gate oxide comprises applying the conductive layer on the gate oxide and on the first zone adjoining the section of the substrate surface.

6. A method for fabricating a semiconductor device having an auxiliary transistor structure, comprising:
   doping a first zone adjoining a section of the substrate surface with a dopant of a first conduction type;
   applying a gate oxide over a portion of the section;
   applying a conductive layer serving as a gate conductor on the gate oxide; and
   forming a protective structure by implanting a second doped region at a distance from the section of the substrate surface, the second doped region extending between two isolation trenches and adjoining the isolation trenches and being doped with a dopant of a second conduction type opposite to the first conduct on type, wherein the protective structure serves to prevent a leakage current path from arising between the gate conductor and the first doped zone.

7. The method of claim 6 wherein fabricating a semiconductor device having an auxiliary transistor structure comprises fabricating a semiconductor device having an auxiliary transistor structure that aids a lithography step.

8. The method of claim 7, wherein the auxiliary transistor structure is introduced into a semiconductor substrate for the purpose of compensating for topology differences.

9. The method of claim 6, wherein applying a conductive layer serving as a gate conductor on the gate oxide comprises applying the conductive layer on the gate oxide and on the first zone adjoining the section of the substrate surface.

10. A method for fabricating a semiconductor memory device, the method comprising:
    forming an array of memory cells in a first region of a substrate;
    providing a second region of the substrate for the auxiliary transistor structures, the second region being adjacent the first region and being doped to a first conduction type at least at a surface;
    forming a gate dielectric over a portion of the second region;
    forming a gate conductor over the gate dielectric; and
    forming doped region within the second region and spaced from the surface, the doped region and surrounding portions of the substrate forming at least two diodes connected oppositely in series.

11. The method of claim 10, wherein the doped region within the second region forms a protective structure for preventing a leakage current path from arising between the gate conductor and the first region of the substrate.

12. The method of claim 10, wherein the auxiliary transistor structures that aid a lithography step are provided in a semiconductor substrate for compensating for topology differences.

13. The method of claim 10, wherein forming a doped region comprises introducing dopants by means of a counter implantation.

14. The method of claim 13, wherein forming a doped region comprises forming a doped region that adjoins isolation trenches disposed in the semiconductor substrate.

* * * * *

UNITED STATES PATENT AND TRADEMARK OFFICE
CERTIFICATE OF CORRECTION

| | | |
|---|---|---|
| PATENT NO. | : 7,112,496 B2 | Page 1 of 1 |
| APPLICATION NO. | : 10/864321 | |
| DATED | : September 26, 2006 | |
| INVENTOR(S) | : Sommer | |

It is certified that error appears in the above-identified patent and that said Letters Patent is hereby corrected as shown below:

Column 6, line 13; delete "conduct on" insert --conduction--

Signed and Sealed this

Twelfth Day of December, 2006

JON W. DUDAS
*Director of the United States Patent and Trademark Office*